United States Patent [19]

Swartz

[11] Patent Number: 5,771,389

[45] Date of Patent: Jun. 23, 1998

[54] LOW SLEW RATE OUTPUT BUFFER WITH STAGED BIASING VOLTAGE

[75] Inventor: Ronald W. Swartz, Orangevale, Calif.

[73] Assignee: Intel Corporation, Santa Clara, Calif.

[21] Appl. No.: 608,143

[22] Filed: Feb. 28, 1996

[51] Int. Cl.⁶ ........................................ G06F 1/26
[52] U.S. Cl. ........................ 395/750.01; 326/28
[58] Field of Search .................... 395/750, 872, 395/750.01, 559; 326/26, 27, 68, 83, 85, 87; 370/402; 361/56, 57

[56] References Cited

U.S. PATENT DOCUMENTS

| | | | |
|---|---|---|---|
| 4,806,794 | 2/1989 | Walters, Jr. | 307/451 |
| 5,089,722 | 2/1992 | Amedeo | 307/443 |
| 5,138,194 | 8/1992 | Yoeli | 326/33 |
| 5,345,357 | 9/1994 | Pianka | 361/56 |
| 5,400,326 | 3/1995 | Smith | 370/401 |
| 5,436,588 | 7/1995 | Ghaffaripour | 327/538 |
| 5,500,610 | 3/1996 | Burstein | 326/85 |
| 5,519,338 | 5/1996 | Campbell et al. | 326/27 |
| 5,568,081 | 10/1996 | Lui et al. | 327/380 |
| 5,576,635 | 11/1996 | Partovi et al. | 326/27 |
| 5,576,639 | 11/1996 | Park | 326/66 |
| 5,613,075 | 3/1997 | Wade et al. | 395/287 |
| 5,619,147 | 4/1997 | Hunley | 326/26 |
| 5,623,216 | 4/1997 | Penza et al. | 326/27 |
| 5,663,664 | 9/1997 | Schmizlein | 326/83 |

*Primary Examiner*—Gopal C. Ray
*Attorney, Agent, or Firm*—Blakely, Sokoloff, Taylor & Zafman

[57] ABSTRACT

A low slew rate buffer is described. The low slew rate buffer comprises an output pad. A first transistor is coupled to the output pad. The first transistor drives the output pad to a first state when the first transistor is switched on. A second transistor is coupled to the output pad. The second transistor drives the output pad to a second state when the second transistor is switched on. A predriving unit is coupled to the first and second transistors. The predriving unit switches the first transistor off and supplies a staged biasing voltage which gradually turns on the second transistor.

8 Claims, 6 Drawing Sheets

5,771,389

LOW SLEW RATE OUTPUT BUFFER WITH STAGED BIASING VOLTAGE

FIELD OF THE INVENTION

The present invention relates to output buffers in integrated circuits. More specifically, the present invention relates to an apparatus and method for providing a low slew rate output buffer.

BACKGROUND OF THE INVENTION

Often times, a slow speed output buffer is desirable for reducing problems associated with high di/dt. Integrated circuit chips are typically mounted on lead frames which are connected to the circuit board by rows of conductive pins. Bonding wires extend from the output pads on the chip to adjacent pads on the lead frame. Lead frame wires extend from the adjacent pads to the conductive pins. As output transistors are switched on and off at higher speeds, larger di/dt transients are generated in the output current flowing through the packaging wires that connect the pad to the circuit board. This increased rate of current change generates noise comprising of voltage spikes on the power rails. The magnitude of the voltage spikes generated along the packaging wires between the chip power pad and the conductive pin is the measurement of di/dt multiplied by the inductance of the lead frame. The voltage spikes cause a voltage differential between the lead location on the circuit board and the bonding pad it is connected to on the integrated circuit. They cause troublesome random events in the chip circuitry such as causing the internal supply to be a different voltage than the voltage of the external supply.

Numerous applications also require the use of slow speed output buffers to reduce problems associated with high dv/dt at the gates of the output transistors. For example, transmission cables which do not offer protective shielding for preventing electromagnetic interference from generating noise on radios and televisions may only be used with devices which operate at lower speeds. The lower speed requirement imposes a lower switching rate on the output transistors of the output buffer.

In the past, designing a slow speed output buffer was difficult because of the sensitive nature of transistors. The fast or slow processing of a transistor and temperature effects change the conductivity of a transistor and the rate at which the transistor switches. Thus, an output buffer designed to drive the gates of the output transistors at a predetermined voltage after a predetermined amount of time might still cause the output transistors to switch too fast or too slowly if the transistors were fast processed or slow processed or if the transistors were operating under varied temperatures.

FIG. 1 is a diagram illustrating the amount of voltage sent to the gate of an output transistor over a period of time in one prior art output buffer design. The amount of voltage supplied was designed to rise at a rate which would cause the transistor to switch slowly at point 110. However, if the transistor was fast processed or if the temperature of the environment in which the transistor operated decreased significantly, the transistor would switch prematurely at point 111. This would result in the output buffer having a slew rate that was too fast. Likewise, if the transistor was slow processed, the transistor would delaying switching until point 112. This would result in the output buffer having a slew rate that was too slow.

One solution for designing a slow speed output buffer was the implementation of feedback to control the amount of current to the output transistors. A capacitor was coupled between the nodes of the output transistors and the input of the gate of one of the output transistor. The feedback was designed so that when the slew rate of the output transistors was too fast and dv/dt was too high, a large amount of current would be removed by the capacitor. As a result, less current was supplied to the node and dv/dt decreased. If the slew rate was too slow and dv/dt was too low, less current would be removed by the capacitor. As a result, more current was supplied to the node and dv/dt increased. The drawback to this approach was that the capacitors were on the same chip with the output buffer. This required valuable die space to be allocated for the capacitors.

SUMMARY OF THE INVENTION

The present invention discloses an output buffer. The output buffer comprises an output pad. A first transistor is coupled to the output pad. The first transistor drives the output pad to a first state when the first transistor is switched on. A second transistor is coupled to the output pad. The second transistor drives the output pad to a second state when the second transistor is switched on. A predriving unit is coupled to the first and second transistors. The predriving unit switches the first transistor off and supplies a staged biasing voltage which gradually turns on the second transistor.

The present invention further discloses a method for driving an output buffer having a first output transistor and a second output transistor. According to the method, the first output transistor is switched off. A first staged biasing voltage is applied to a gate of the second output transistor.

BRIEF DESCRIPTION OF THE DRAWINGS

The present invention is illustrated by way of example and not limitation in the figures of the accompanying drawings in which like references indicate similar elements and in which.

DETAILED DESCRIPTION

A novel output buffer is disclosed. In the following detailed description, numerous specific details are set forth in order to provide a thorough understanding of the present invention. However, it will be understood by those skilled in the art that the present invention may be practiced without these specific details. In other instances, well-known methods, procedures, components, and circuits have not been described in detail so as not to obscure the present invention.

Figure 1:
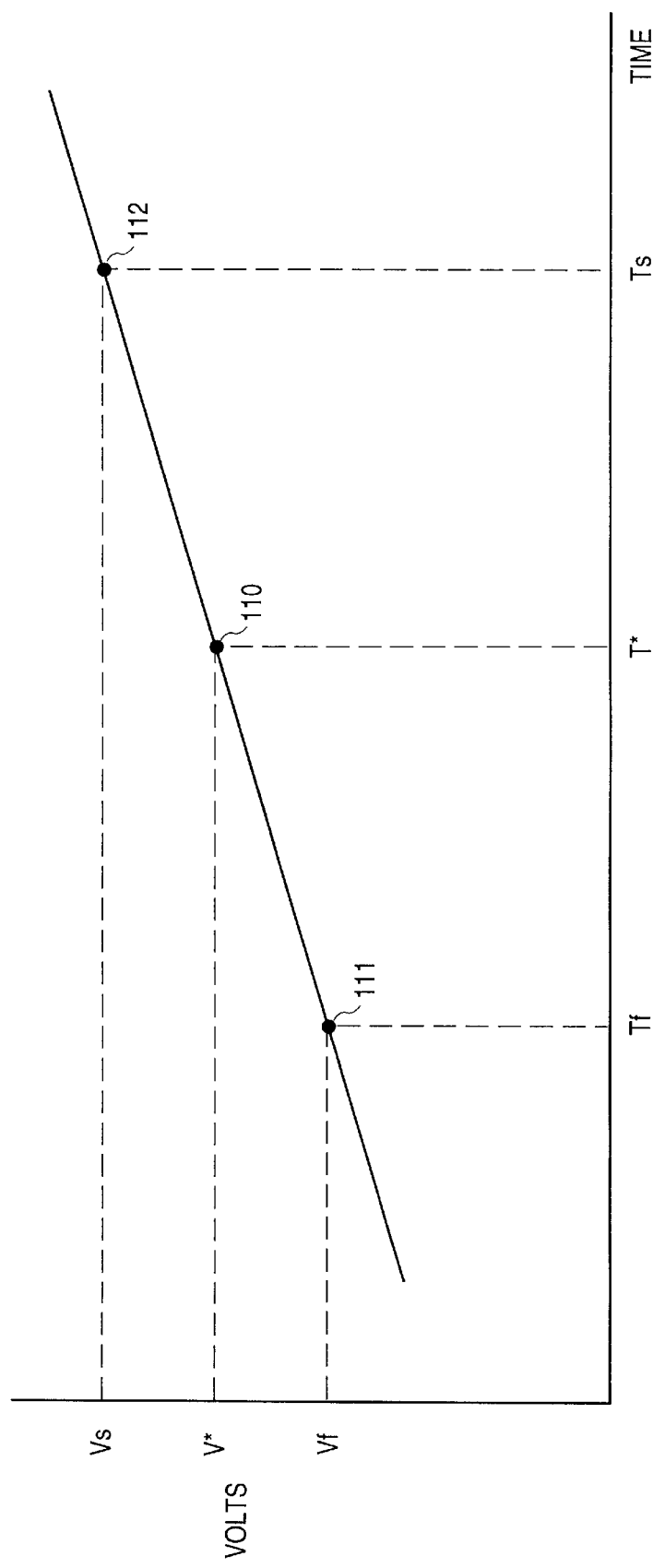
FIG. 1 illustrates the amount of voltage sent to the gate of an output transistor over time in a prior art output buffer.
Figure 2:
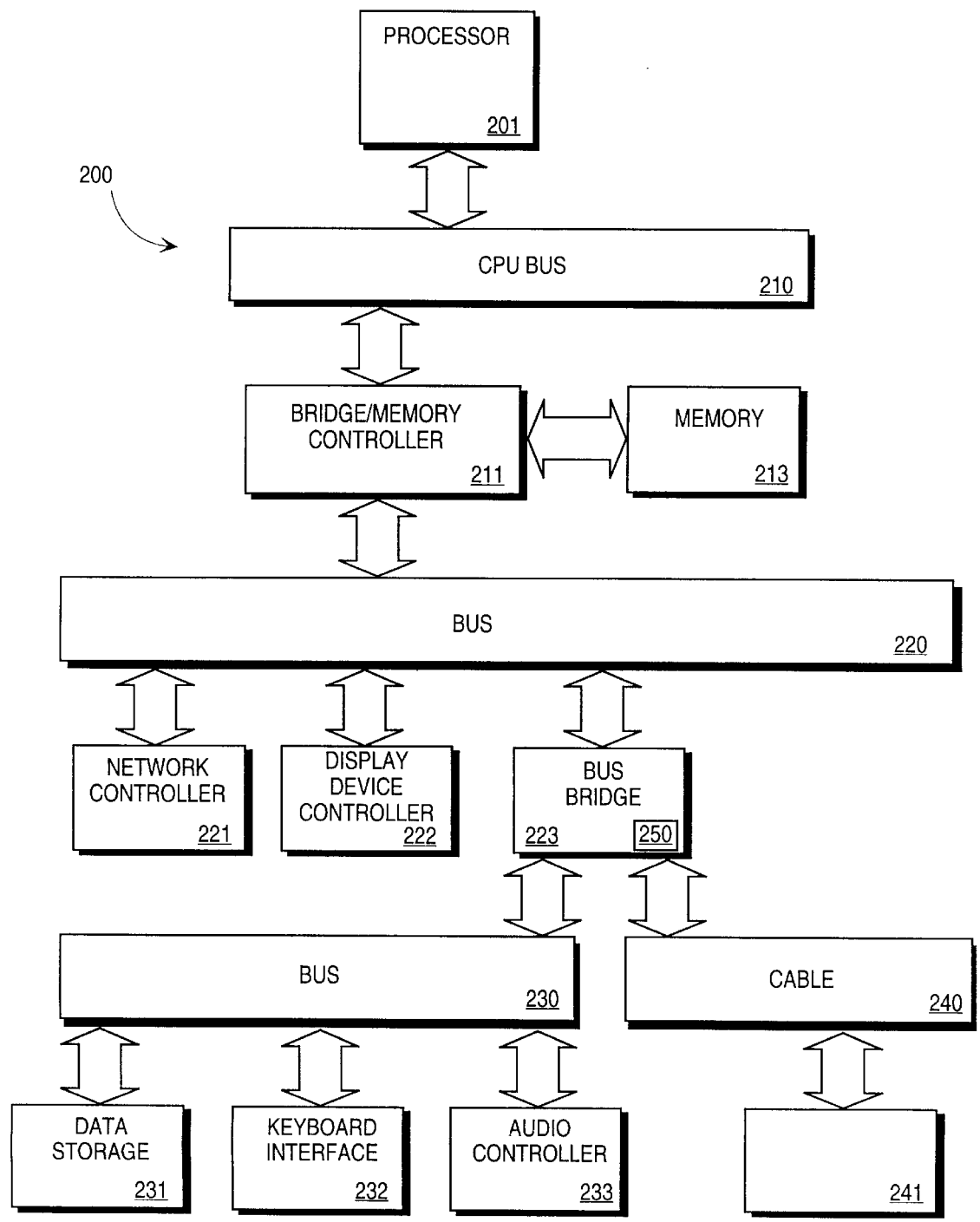
FIG. 2 illustrates an embodiment of the present invention as implemented in a computer system.

FIG. 2 illustrates in block diagram form a computer system 200 of one embodiment of the present invention. The computer system comprises processor 201 for processing digital data. Processor 201 can be a complex instruction set computing (CISC) microprocessor, a reduced instruction set computing (RISC) microprocessor, a very long instruction word (VLIW) microprocessor or other processor device. Processor 201 is coupled to CPU bus 210 which transmits signals between processor 201 and other components in the computer system. Memory 213 is coupled to CPU bus 210 and comprises a dynamic random access memory (DRAM) device, a static random access memory (SRAM) device, or other memory devices. Memory 213 stores information or other intermediate data during execution by processor 201. Bridge memory controller 211 is coupled to CPU bus 210 and memory 213. Bridge memory controller 211 directs data traffic between processor 201, memory 213, and other components in the computer system and bridges signals from these components to high speed I/O bus 220.

I/O bus 220 supports peripherals operating at high data throughput rates. Bus 220 can be a single bus or a combination of multiple buses. As an example, bus 220 can comprise a Peripheral Components Interconnect (PCI) bus, a Personal Computer Memory Card International Association (PCMCIA) bus, a VL bus or other buses. Bus 220 provides communication links between components in the computer system. Network controller 221 links a network of computers together and provides communication among the machines. Display device controller 222 is coupled to high speed I/O bus 220. Display device controller 222 allows coupling of a display device to the computer system and acts as an interface between the display device and the computer system. Display device controller 222 can be a monochrome display adapter (MDA) card, a color graphics adapter (CGA) card, enhanced graphics adapter (EGA) card, multi-color graphics array (MCGA) card, video graphics array (VGA) card, extended graphics array (XGA) card or other display device controller. The display device can be a television set, a computer monitor, a flat panel display or other display device. The display device receives information and data from processor 201 through display device controller 222 and displays the information and data to the user of the computer system.

I/O bus 230 is used for communicating information between peripheral device which operate at lower throughput rates. I/O bus 230 can be a single bus or a combination of multiple buses. As an example, bus 230 can comprise an Industry Standard Architecture (ISA) bus, an Extended Industry Standard Architecture (EISA) bus or a Micro Channel Architecture (MCA) bus. Bus 230 provides communication links between components in the computer system. Keyboard interface 232 can be a keyboard controller or other keyboard interface. Keyboard interface 232 can be a dedicated device or can reside in another device such as a bus controller or other controller. Keyboard interface 232 allows coupling of a keyboard to the computer system and transmits signals from a keyboard to the computer system. Mass storage device 231 can be a hard disk drive, a floppy disk drive, a CD-ROM device, a flash memory device or other mass storage device. Audio controller 233 operates to coordinate the recording and playing of sounds is also coupled to I/O bus 230. Bus bridge 223 couples bus 220 to bus 230.

Cable 240 operates to connect peripheral devices to computer system 200. Cable 240 may be a Universal Serial Bus for example. Peripheral 241 is connected to computer system 200 by cable 240. Peripheral 241 may be a mouse, a modem, a scanner or a printer for example.

Bus bridge 223 comprises a translator to bridge signals between bus 220 and 230 and bus 220 and cable 240. Bus bridge 223 further comprises output buffer 250 for driving signals between bus bridge 223 and cable 240.

In one embodiment of the present invention, output buffer 250 comprises an output pad, a first transistor coupled to the output pad, and a second transistor coupled to the output pad. When the first transistor is switched on, the output pad is driven to a first state. When the second transistor is switched on, the output pad is driven to a second state. Output buffer 250 operates to provide a low speed output to cable 240. When a first transition is to occur on the output pad, the second transistor is switched off. The gate of the first transistor is biased to the threshold or turn-on voltage of the first transistor. A staged bias voltage is then applied to the gate of the first transistor. The bias voltage is staged in that after a period of time (a stage), the rate of the gate voltage ramp is changed. The rate of the gate voltage ramp continues to be changed after a period of time for a plurality of periods. As a result, the gate voltage ramp at the first transistor is not linear with respect to time. When a second transition is to occur on the output pad, the first transistor is switched off. The gate of the second transistor is biased to the threshold or turn-on voltage of the first transistor. A staged bias voltage is then applied to the gate of the second transistor. The bias voltage is also staged in that after a period of time, the rate of the gate voltage ramp is also changed. The rate of the gate voltage ramp continues to be changed after a period of time for a plurality of periods. As a result, the gate voltage ramp at the second transistor is not linear with respect to time.

Output buffer devices processed under fast conditions will switch outputs relatively early in the enable time because of the low gate voltage requirement. Output buffer devices processed under slow conditions will switch later in the enable time because of a higher gate voltage. However, with the non-linear gate voltage ramp, output buffer 250 is able to provide an output slew rate that is relatively stable.

The output slew rate is a function of the current sink/source capability of the output driver and the load capacitance. By using the staged, non-linear gate voltage, fast drivers (buffers) will sink/source enough current to discharge/charge the load capacitance at a relatively low gate voltage. For slow drivers, this same relatively small gate voltage will sink/source much less current. However, since the gate voltage ramp is non-linear (and increases with each stage), a couple of stages later the gate voltage will be enough for the slow driver to sink/source enough current to discharge/charge the load at about the same rate as the fast driver with the lower gate voltage.

Figure 3:
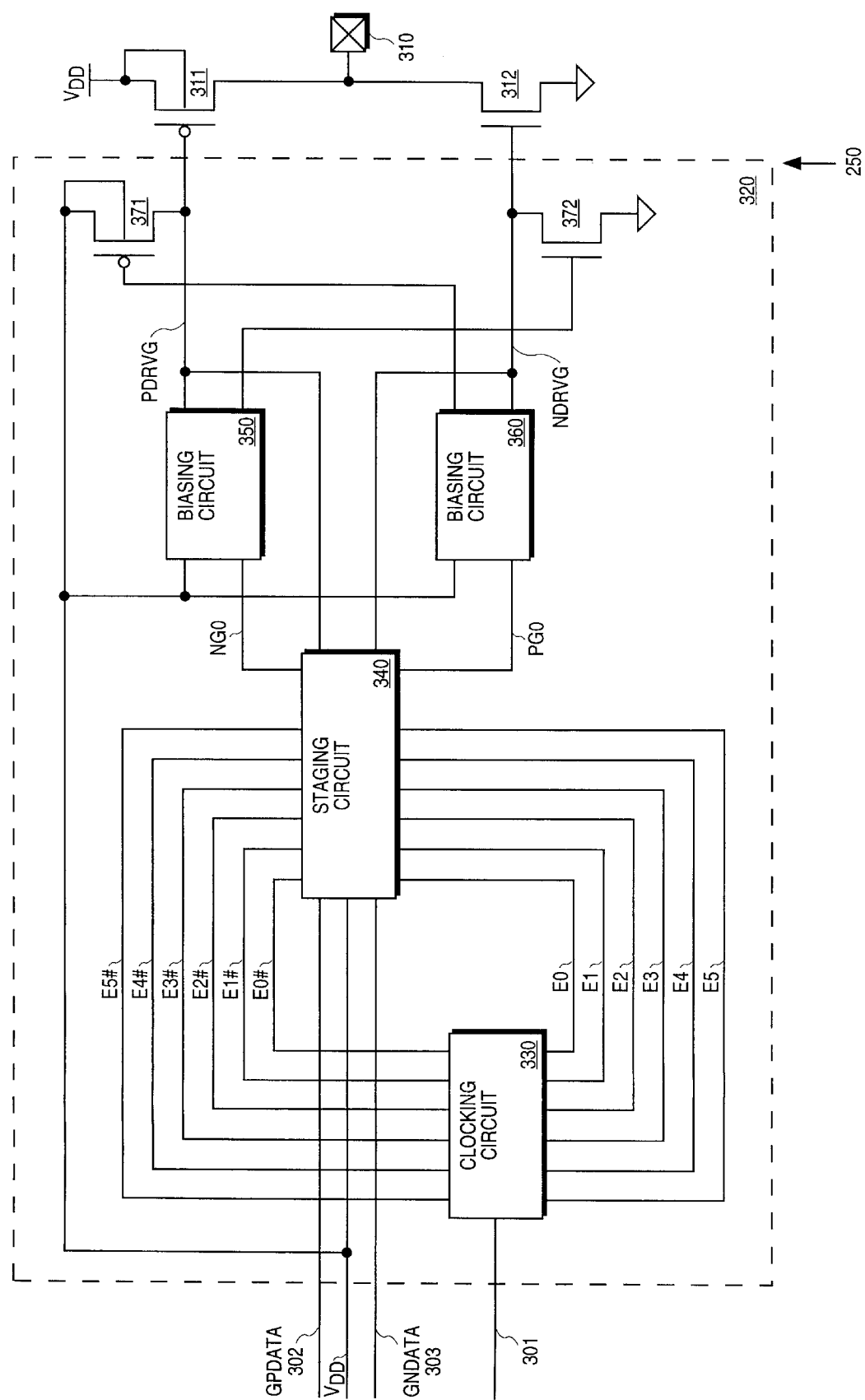
FIG. 3 illustrates an output buffer according to an embodiment of the present invention.

FIG. 3 illustrates output buffer 250 according to an embodiment of the present invention. Output buffer 250 comprises output pad 310. Output transistor 311 and output transistor 312 are coupled to output pad 310. Output transistor 311 is coupled to a voltage source and operates as a pull up transistor. Output transistor 312 is coupled to a reference voltage and operates as a pull down transistor. In one embodiment of the present invention, the reference voltage is ground. Output transistor 311 connects output pad 310 to the voltage source when output transistor 311 is switched on. As a result, output transistor 311 drives output pad 310 to a first state when output transistor 311 is switched on. Output transistor 312 connects output pad 310 to a reference voltage when output transistor 312 is switched on and 311 is switched off. As a result, output transistor 312 drives output pad 310 to a second state when output transistor 312 is switched on.

Output buffer 250 further comprises predriving unit 320 for controlling the voltages at the gates of output transistors 311 and 312. Predriving unit 320 comprises docking circuit 330, staging circuit 340, biasing circuits 350 and 360, and transistors 371 and 372. Clocking circuit 330 is coupled to staging circuit 340 and output transition line 301. Output transition line 301 is asserted whenever the state at output pad 310 is to be changed. Clocking circuit 330 operates to control the period of time a rate of voltage change is applied to the gates of output transistors 311 and 312. When output pad 310 is at a second state and output transition line 301 is asserted, clocking circuit 330 responds by sending a signal to staging circuit 340 to indicate that output pad 310 is to be driven to a first state. Clocking circuit 330 starts a timer. The timer times a period of predetermined length. At the end of the period, clocking circuit 330 sends a signal to staging circuit 340 indicating that a first stage has transpired and a new stage has begun. Each period or stage may be the same length of time or a different length of time. Clocking circuit 330 continues to send a set of signals indicating to the staging circuit 340 that output pad 310 is to be driven to a first state and that a new stage has begun until output transition line 301 is asserted again or until the timer has transpired.

Similarly, when output pad 310 is at a first state and output transition line 301 is asserted, docking circuit 330 responds by sending a signal to staging circuit 340 to indicate that output pad 310 is to be driven to a second state. Clocking circuit 330 then starts a timer. The timer times a period of predetermined length. At the end of the period, clocking circuit 330 sends a signal to staging circuit 340 indicting that a first stage has transpired and a new stage has begun. Each of these periods or stages may be the same length of time or a different length of time. Clocking circuit 330 continues to send a set of signals indicating to the staging circuit 340 that output pad 310 is to be driven to a second state and that a new stage has begun until output transition line 301 is asserted. In one embodiment of the present invention, clocking circuit 330 provides a plurality of connections between clocking circuit 330 and staging circuit 340. Each of the plurality of connections is designated for sending a signal when a new stage has begun. For example, when docking circuit receives a signal from output transition line 301 indicating that output pad 310 is to be driven to a first state, first enable bar line, E0#, is asserted. When the first stage is timed out, second enable bar line, E1#, is asserted by clocking circuit 330. Likewise, when clocking circuit receives a signal from output transition line 301 indicating that output pad 310 is to be driven to a second state, first enable line, E0, is asserted. When the first stage is timed out, second enable line, E1, is asserted by clocking circuit 330. In one embodiment of the present invention, lines E0, E1, E2, E3, E4, and E5 are asserted and deasserted complementary to lines E0#, E1#, E2#, E3#, E4#, and E5#. Clocking circuit 330 may be implemented by any known circuit.

Staging circuit 340 is coupled to clocking circuit 330 and biasing circuits 350 and 360. Staging circuit 340 operates to generate a voltage applied to transistors 311 and 312 during different stages timed by clocking circuit 330 to switch on transistors 311 and 312. Upon receiving a signal indicating that output pad 310 is to be driven to a first state, staging circuit 340 sends a pull up transistor biasing signal to biasing circuit 350. This signal is sent on line NG0. Staging circuit 340 then delivers a first predetermined amount of current to be applied to transistor 311 during the first stage on line PDRVG. Upon receiving a signal from clocking circuit 330 indicating that the first stage has transpired, staging circuit 340 proceeds in delivering a second predetermined amount of current to be applied to transistor 311 during the second stage on line PDRVG. Staging circuit 340 proceeds in sinking a different amount of current from the gate of transistor 311 during each stage until the timer in clocking circuit 330 expires or until staging circuit 340 receives a signal from clocking circuit 330 indicating that output pad 310 is to be driven to a second state. In this embodiment of the present invention, output transistor 311 is a PMOS transistor which begins switching when the voltage level applied to its gate is below $V_{DD}$—its threshold voltage. The amount of current staging circuit 340 sinks from the gate of output transistor 311 increases during each stage in nonlinear increments.

Similarly, upon receiving a signal indicating that output pad 310 is to be driven to a second state, staging circuit 340 sends a pull down transistor biasing signal to biasing circuit 360. This signal is sent on line PG0. Staging circuit 340 then delivers a first predetermined amount of current to be applied to transistor 312 during the first stage on line NDRVG. Upon receiving a signal from clocking circuit 330 indicating that the first stage has transpired, staging circuit 340 delivers a second predetermined amount of current to be applied to transistor 312 during the second stage on line NDRVG. Staging circuit 340 proceeds in delivering a different amount of current to the gate of transistor 311 during each stage until the timer in clocking circuit 330 has expired or until staging circuit 340 receives a signal from clocking circuit 330 indicating that output pad 310 is to be driven to a first state. In this embodiment of the present invention, output transistor 312 is a NMOS transistor which begins switching when the voltage level applied to its gate is above its threshold voltage. The amount of current staging circuit 340 delivers to the gate of output transistor 312 increases during each stage in nonlinear increments. Staging circuit 340 may be implemented by any known circuitry. In a preferred embodiment of the present invention, staging circuit 340 is coupled to GPDATA line 302 and GNDATA line 303. Staging circuit 340 generates a voltage to be applied to output transistor 311 when GPDATA line 302 is asserted. Staging circuit 340 generates a voltage to be applied to output transistor 312 when GNDATA 303 is asserted.

Biasing circuit 350 is coupled to staging circuit 340, output transistor 311, and transistor 372. Upon receiving a pull up transistor biasing signal from staging circuit 340, biasing circuit 350 switches output transistor 312 off by switching transistor 372 on. When transistor 372 is switched on, transistor 372 drives the voltage at the gate of output transistor 312 to ground. Biasing circuit 350 then delivers the threshold voltage of output transistor 311 to the gate of output transistor 311. The switching off of output transistor 312 and the delivery of the threshold voltage to the gate of output transistor 311 is achieved during the first stage before staging circuit sinks a predetermined amount of current from the gate of output transistor 311. Biasing circuit 350 may be implemented by any known circuitry.

Biasing circuit 360 is coupled to staging circuit 340, output transistor 312, and transistor 371. Upon receiving a pull down transistor biasing signal from staging circuit 340, biasing circuit 360 switches output transistor 311 off by switching transistor 371 on. When transistor 371 is switched on, transistor 371 drives the voltage at the gate of output transistor 312 to a voltage level greater than its threshold voltage. Biasing circuit 360 then delivers the threshold voltage of output transistor 312 to the gate of output transistor 312. The switching off of output transistor 311 and the delivery of the threshold voltage to the gate of output transistor 312 is achieved during the first stage before staging circuit delivers a predetermined amount of current to the gate of output transistor 312. Biasing circuit 360 may be implemented by any known circuitry.

Figure 4:
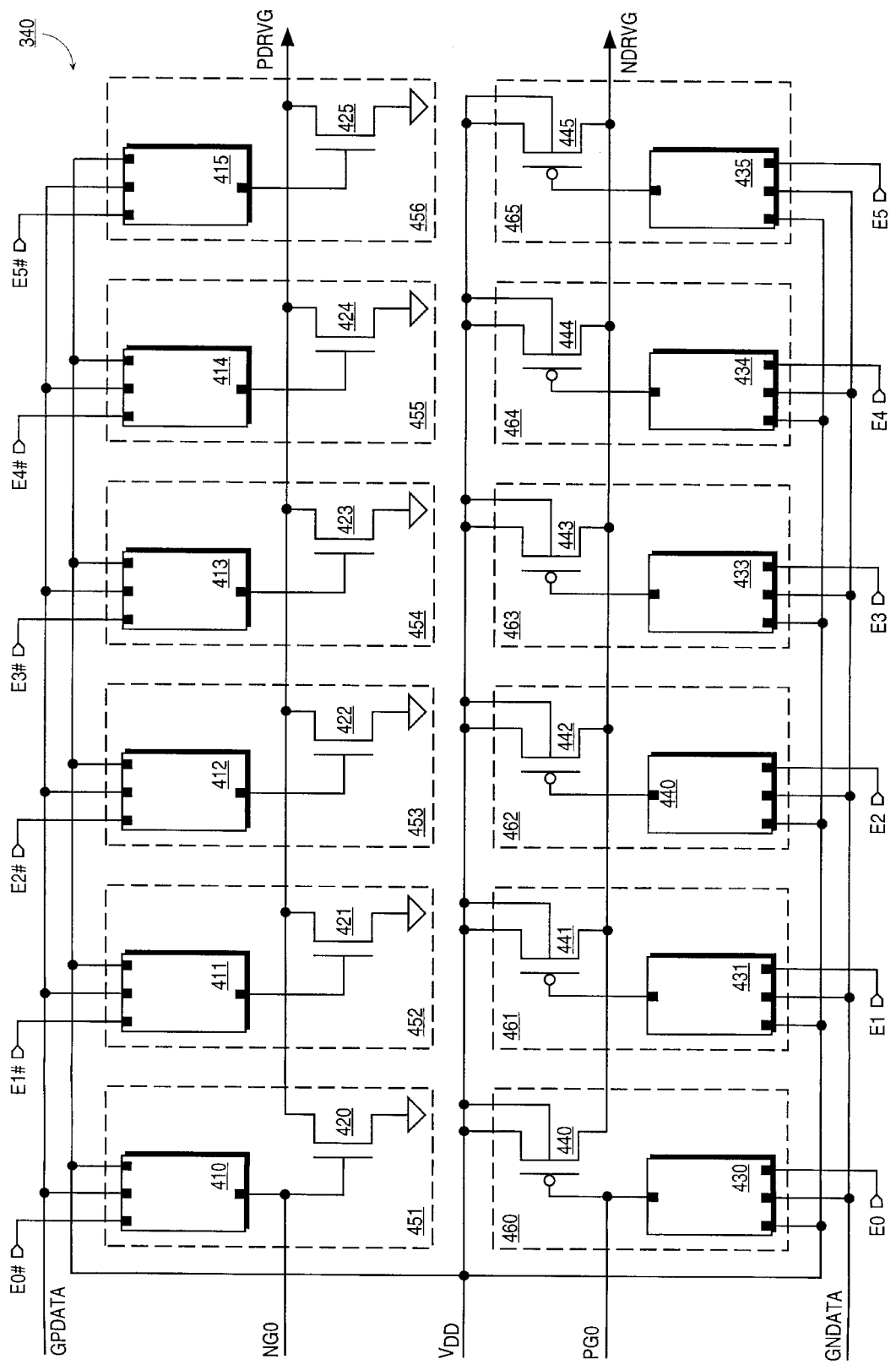
FIG. 4 illustrates a schematic of one embodiment of a staging circuit according to an embodiment of the present invention.

FIG. 4 illustrates one embodiment of staging circuit 340 according to one embodiment of the present invention. Staging circuit 340 comprises a first set of predriving circuits 450, 451, 452, 453, 454, and 455 for controlling the current sunk from the gate of output transistor 311. Each of the predriving circuits 450, 451, 452, 453, 454, and 455 comprises a NOR circuit and a NMOS transistor. Each of the NOR circuits 410, 411, 412, 413, 414, and 415 has two input terminals. The input terminals are connected to GPDATA line 302 and one of the plurality of connections from clocking circuit 330. The NOR circuits 410, 411, 412, 413, 414, and 415 output a high signal when the inputs to the NOR circuits 410, 411, 412, 413, 414, and 415 are low. Line NG0 is connected to the output of NOR circuit 410. Each of the NOR circuits are connected to a gate of an NMOS transistor. The source of NMOS transistors 420, 421, 422, 423, 424, and 425 are connected to ground. The drain of the NMOS transistors 420, 421, 422, 423, 424, and 425 are connected to the line PDRVG. When output pad 310 is to be driven from a second state to a first state, GPDATA line 301 is deasserted and line E0# from clocking circuit 330 is asserted. As a result, NOR circuit 410 outputs a high signal on its output terminal. The high signal is sent to line NG0. When line NG0 is asserted, biasing circuit 350 switches output transistor 312 off and applies a threshold voltage on the gate of output transistor 311. The high signal on the output terminal of NOR circuit 410 also switches NMOS transistor 420 on. As a result, NMOS transistor begins to pull the voltage on line PDRVG to ground. This causes the voltage applied to the gate of output transistor 311 to decrease at a predetermined rate. Clocking circuit 330 asserts line E1# during the second stage. NOR circuit 411 switches on NMOS transistor 421. As a result, the voltage on line PDRVG drops at a different predetermined rate. NOR gates 412, 413, 414, and 415 proceed to turn on NMOS transistors 422, 423, 424, and 425 in a similar matter during each proceeding stage until either GPDATA line 302 is asserted, indicating that output pad 310 is to be driven from the first state to a second state, or until the timer in clocking circuit 330 expires.

Staging circuit 340 further comprises a second set of predriving circuits 460, 461, 462, 463, 464, and 465 for controlling the voltage delivered to output transistor 312. Each of the predriving circuits 460, 461, 462, 463, 464, and 465 comprises a NAND circuit and a PMOS transistor. Each of the NAND circuits 450, 451, 452, 453, 454, and 455 has two input terminals. The input terminals are connected to GNDATA line 303 and one of the plurality of connections from clocking circuit 330. The NAND circuits 450, 451, 452, 453, 454, and 455 output a low signal when the inputs to the NAND circuits 450, 451, 452, 453, 454, and 455 are high. Line PG0 is connected to the output of NAND circuit 450. Each of the NAND circuits are connected to a gate of a PMOS transistor. The source of PMOS transistors 440, 441, 442, 443, 444, and 445 are connected to line NDRVG. The drain of the PMOS transistors 440, 441, 442, 443, 444, and 445 are connected to voltage supply $V_{DD}$. When output pad 310 is to be driven from a first state to a second state, GNDATA line 303 is asserted and line E0 from clocking circuit 330 is asserted. As a result, NAND circuit 450 outputs a low signal on its output terminal. The low signal is sent to line PG0. When line PG0 is deasserted, biasing circuit 360 switches output transistor 311 off and applies a threshold voltage on the gate of output transistor 312. The low signal on the output terminal of NAND circuit 450 also switches PMOS transistor 440 on. As a result, PMOS transistor connects voltage supply $V_{DD}$ to line NDRVG. This causes the voltage applied to the gate of output transistor 312 to increase at a predetermined rate. Clocking circuit 330 asserts line E1 during the second stage. NAND circuit 431 switches on PMOS transistor 441. As a result, the voltage on line NDRVG increases at a different predetermined rate. NAND gates 432, 433, 434, and 435 proceed to turn on PMOS transistors 442, 443, 444, and 445 in a similar matter during each proceeding stage until either GNDATA line 303 is deasserted, indicating that output pad 310 is to be driven from the second state to a first state, or until the timer in clocking circuit 330 expires.

Figure 5A:
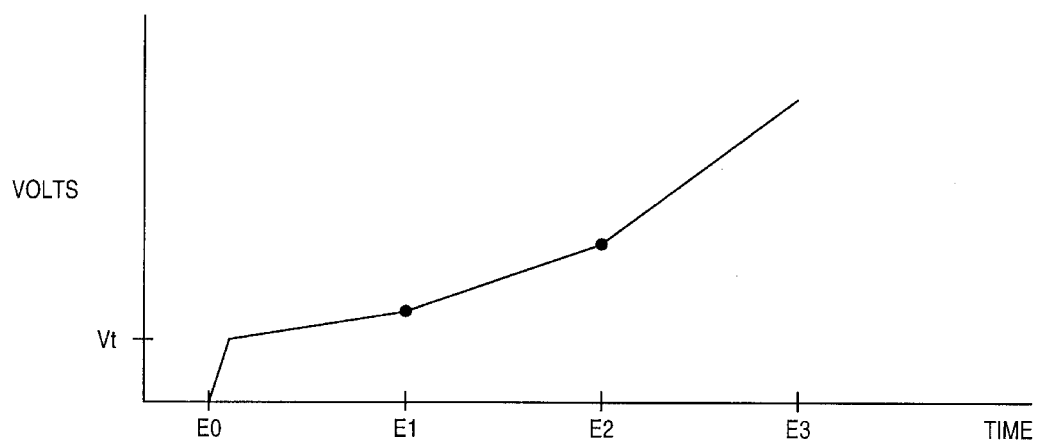
FIG. 5A illustrates the amount of voltage sent to the gate of a pull down output transistor over time in an output buffer according to an embodiment of the present invention.

FIG. 5A illustrates the amount of voltage sent to the gate of output transistor 312 over a period of time according to one embodiment of the present invention. At time E0, clocking circuit 330 asserts line E0. As a result, biasing circuit 360 delivers Vt, the threshold voltage of output transistor 312, to the gate of output transistor 312. Staging circuit 340 also delivers a first predetermined amount of current to the gate of output transistor 312 during the first stage, indicated between time E0 and E1. At time E1, clocking circuit 330 asserts line E1. As a result, staging circuit 340 delivers a second predetermined amount of current to the gate of output transistor 312 during a second stage, indicated between time E1 and E2. At time E2, clocking circuit 330 asserts line E2. As a result, staging circuit 340 delivers a third predetermined amount of current to the gate of output transistor 312 during a second stage, indicated between time E1 and E2.

Figure 5B:
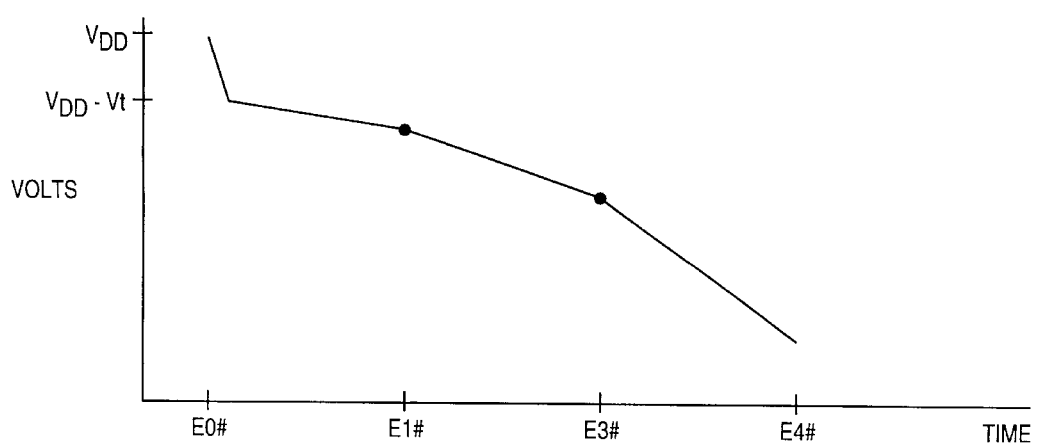
FIG. 5B illustrates the amount of voltage sent to the gate of a pull up output transistor over time in an output buffer according to an embodiment of the present invention.

FIG. 5B illustrates the amount of voltage delivered to the gate of output transistor 311 over a period of time according to one embodiment of the present invention. At time E0#, docking circuit 330 asserts line E0#. As a result, biasing circuit 350 delivers a voltage $V_{DD}$–$V_T$, the threshold voltage of output transistor 311, to the gate of output transistor 311. Staging circuit 340 also sinks a first predetermined amount of current from the gate of output transistor 311 during the first stage, indicated between time E0# and E1#. At time E1#, clocking circuit 330 deasserts line E1#. As a result, staging circuit 340 sinks a second predetermined amount of current from the gate of output transistor 311 during a second stage, indicated between time E1# and E2#. At time E2#, docking circuit 330 deasserts line E2#. As a result, staging circuit 340 sinks a third predetermined amount of current from the gate of output transistor 311 during a second stage, indicated between time E1# and E2#.

Figure 6:
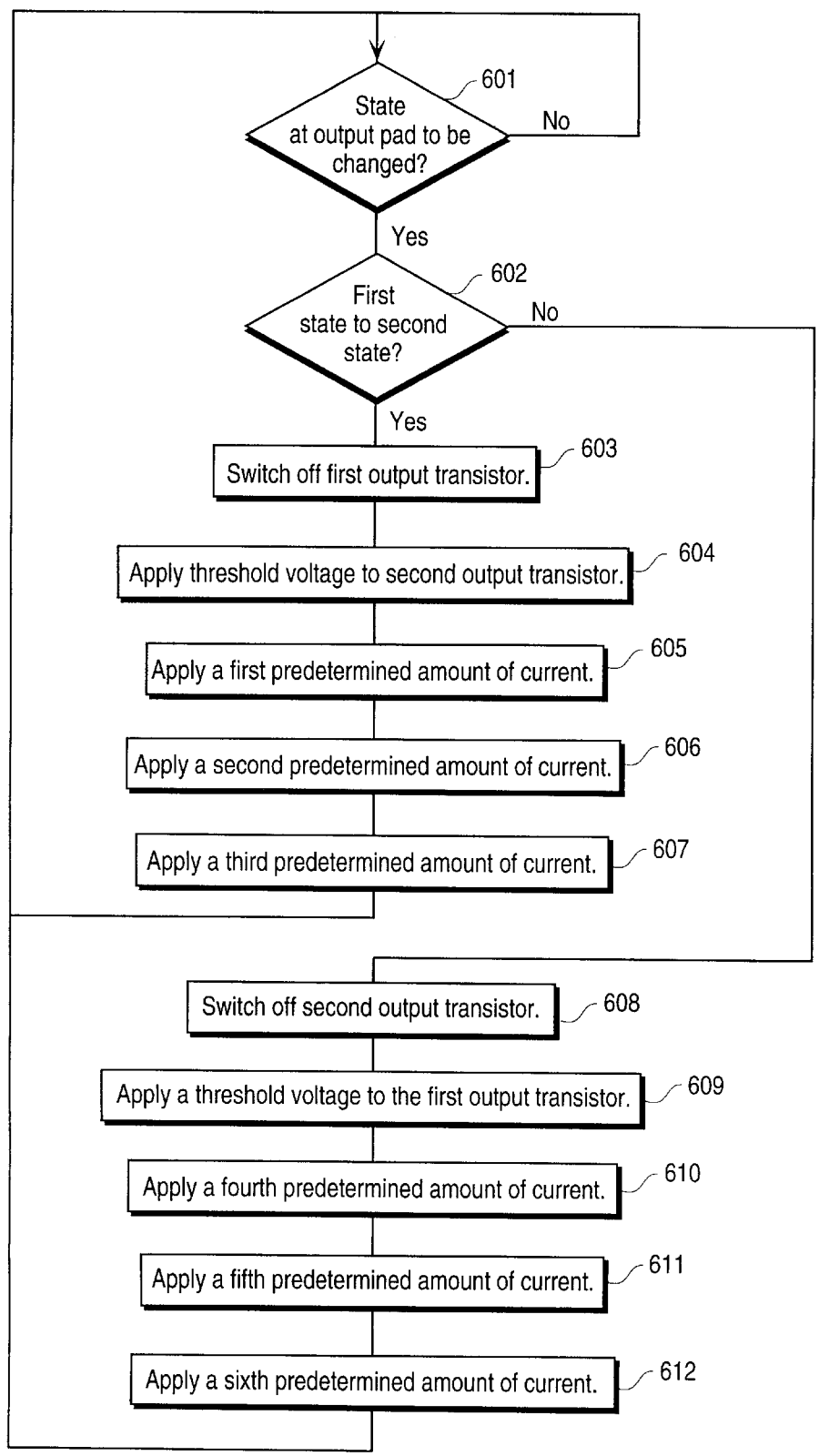
FIG. 6 is a flow chart illustrating a method for driving an output buffer having a first output transistor and a second output transistor according to an embodiment of the present invention.

FIG. 6 is a flow chart illustrating a method for driving an output buffer having an output pad, a first transistor coupled to the output pad where the first transistor drives the output pad to a first state when the first transistor is switched on, and a second transistor coupled to the output pad where the second transistor drives the output pad to a second state when the second transistor is switched on. At step 601, determine if the state at the output pad is to be changed. If the state at the output pad does not need to be changed, control returns to step 601. If the state at the output pad needs to be changed, control proceeds to step 602.

At step 602, determine whether the output pad needs to be changed from a first state to a second state or a second state to a first state. If the output pad needs to be changed from a first state to a second state, control proceeds to step 603. If the output pad needs to be changed from a second state to a first state, control proceeds to step 608.

At step 603, switch off the first output transistor.

At step 604, apply a threshold voltage to the gate of the second output transistor.

At step 605, apply a first predetermined amount of current to the gate of the second output transistor.

At step 606, after a first predetermined amount of time, begin applying a second predetermined amount of current to the gate of the second output transistor.

At step 607, after a second predetermined period of time, begin applying a third predetermined amount of current to the gate of the second output transistor. Control proceeds to step 601.

At step 608, switch off the second output transistor.

At step 609, apply a threshold voltage to the gate of the first output transistor.

At step 610, apply a fourth predetermined amount of current at the gate of the first output transistor.

At step 611, after a third predetermined amount of time, begin applying a fifth predetermined amount of current to the gate of the first output transistor.

At step 612, after a fourth predetermined amount of time, begin applying a sixth predetermined amount of current to the gate of the first output transistor. Control proceeds to step 601.

In the foregoing description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

What is claimed is:

1. A predriver unit for controlling voltage at a gate of an output transistor comprising:

a clocking circuit:

a first predriving circuit, coupled to the clocking circuit and the gate of the output transistor, that supplies a first predetermined current to the gate of the output transistor in response to receiving a first signal from the clocking circuit; and a second predriving circuit, coupled to the clocking circuit and the gate of the output transistor, that supplies a second predetermined current to the gate of the output transistor in response to receiving a second signal from the clocking circuit.

2. The apparatus in claim 1, wherein the first predriving circuit comprises a first switch, coupled to a power supply and a first enable line, that connects the power supply to the gate of the output transistor in response to receiving a signal from the first enable line.

3. The apparatus of claim 1, wherein the second predriving circuit comprises a second switch, coupled to a power supply and a second enable line, that connects the power supply to the gate of the output transistor in response to receiving a signal from the second enable line.

4. A method for driving an output buffer having a first output transistor and a second output transistor, comprising:

switching off the first output transistor; and applying a a threshold voltage of the second output transistor at a gate of the second output transistor;

applying a first predetermined amount of current at the gate of the second output transistor upon receiving a first signal from a clocking circuit; and applying a second predetermined amount of current at the gate of the second output transistor upon receiving a second signal from the clocking circuit.

5. The method of claim 4 further comprising the step of:

turning off the second transistor;

applying a threshold voltage of the first output transistor at a gate of the first output transistor applying a third predetermined amount of current at the gate of the first output transistor upon receiving a third signal from the clocking circuit; and applying a fourth predetermined amount of current at the gate of the first output transistor upon receiving a fourth signal from the clocking circuit.

6. An output buffer comprising:

an output pad;

a first transistor, coupled to the output pad, that drives the output pad to a first state when the first transistor is switched on;

a second transistor, coupled to the output pad, that drives the output pad to a second state when the second transistor is switched on; and a predriving unit, coupled to the first and second transistors, that switches the first transistor off and that includes a first predriving circuit that supplies a first biasing voltage to the gate of the second transistor in response to receiving a first signal from a clocking circuit and a second predriving circuit that supplies a second biasing voltage to the gate of the second transistor in response to receiving a second signal from the clocking circuit.

7. The apparatus in claim 6, wherein the first predriving circuit comprises a first switch, coupled to a power supply and a first enable line, that connects the power supply to a gate of the second transistor in response to receiving the first signal on the first enable line.

8. The apparatus of claim 6, wherein the second predriving circuit comprises a second switch, coupled to a power supply and a second enable line, that connects the power supply to a gate of the second transistor in response to receiving the second signal from the second enable line.

* * * * *

UNITED STATES PATENT AND TRADEMARK OFFICE
CERTIFICATE OF CORRECTION

PATENT NO.  : 5,771,389
DATED       : June 23, 1998
INVENTOR(S) : Ronald W. Swartz It is certified that error appears in the above-identified patent and that said Letters Patent is hereby corrected as shown below:

In column 5 at line 6 delete "docking" and insert --clocking--

In column 5 at line 29 delete "docking" and insert --clocking--

In column 8 at line 40 delete "docking" and insert --clocking--

In column 8 at line 50 delete "docking" and insert --clocking--

Signed and Sealed this

Second Day of February, 1999

*Attest:*

*Attesting Officer*

*Acting Commissioner of Patents and Trademarks*